United States Patent
Carlson et al.

(10) Patent No.: US 10,969,029 B2
(45) Date of Patent: Apr. 6, 2021

(54) LOW PARTICLE PROTECTED FLAPPER VALVE

(71) Applicant: Applied Materials, Inc., Santa Clara, CA (US)

(72) Inventors: Charles T. Carlson, Austin, TX (US); Tammy Jo Pride, Pflugerville, TX (US); Benjamin B. Riordon, Newburyport, MA (US); Aaron Webb, Austin, TX (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 16/341,703

(22) PCT Filed: Dec. 1, 2017

(86) PCT No.: PCT/US2017/064320
§ 371 (c)(1),
(2) Date: Apr. 12, 2019

(87) PCT Pub. No.: WO2018/102757
PCT Pub. Date: Jun. 7, 2018

(65) Prior Publication Data
US 2019/0293199 A1    Sep. 26, 2019

Related U.S. Application Data (60) Provisional application No. 62/429,562, filed on Dec. 2, 2016.

(51) Int. Cl.
*F16K 27/02* (2006.01)
*F16K 1/20* (2006.01)
(Continued)

(52) U.S. Cl.
CPC ............ *F16K 27/0227* (2013.01); *F16K 1/20* (2013.01); *F16K 1/2021* (2013.01); *F16K 1/223* (2013.01);
(Continued)

(58) Field of Classification Search
CPC .......... F16K 1/20; F16K 1/2021; F16K 1/223; F16K 11/10; F16K 27/0209;
(Continued)

(56) References Cited

U.S. PATENT DOCUMENTS

| | | | |
|---|---|---|---|
| 1,332,000 A | | 2/1920 | Pfau |
| 3,074,427 A | * | 1/1963 | Wheeler, Jr. ............ F16K 1/223 137/512.1 |

(Continued)

FOREIGN PATENT DOCUMENTS

| | | |
|---|---|---|
| CN | 201548035 U | 8/2010 |
| JP | H0771206 A | 3/1995 |

OTHER PUBLICATIONS

International Search Report and Written Opinion for Application No. PCT/US2017/064320 dated Mar. 19, 2018.
(Continued)

*Primary Examiner* — Craig J Price
(74) *Attorney, Agent, or Firm* — Patterson + Sheridan, LLP (57) ABSTRACT

Embodiments of the disclosure generally relate to a flapper valve. The flapper valve may be used with processing chambers, such as semiconductor substrate processing chambers. In one embodiment, a flapper valve includes a housing having a first opening at a first end thereof and a second opening at a second end thereof, a first flapper pivotably disposed in the housing, and a second flapper pivotably disposed in the housing. The first and second
(Continued)

flappers are movable to selectively open and close at least one of the first opening and the second opening.

20 Claims, 5 Drawing Sheets

(51) Int. Cl.
  *F16K 11/10* (2006.01)
  *F16K 1/22* (2006.01)
  *H01L 21/67* (2006.01)

(52) U.S. Cl.
  CPC .......... *F16K 11/10* (2013.01); *F16K 27/0218* (2013.01); *H01L 21/67017* (2013.01); *Y10T 137/0525* (2015.04); *Y10T 137/6028* (2015.04); *Y10T 137/88062* (2015.04)

(58) Field of Classification Search
  CPC ............. F16K 27/0218; F16K 27/0227; F16K 31/52441; F16K 39/028; H01L 21/67017; Y10T 137/88062; Y10T 137/0491; Y10T 137/0525; Y10T 137/0402; Y10T 137/6028
  USPC ..... 137/614.21, 315.16, 15.18, 15.25, 15.01, 137/520, 521, 527, 527.2, 527.4, 527.6, 137/527.8, 613, 627.5, 628, 630, 630.16; 251/228
  See application file for complete search history.

(56) References Cited

U.S. PATENT DOCUMENTS

| | | | | |
|---|---|---|---|---|
| 3,587,601 | A * | 6/1971 | Shippy | F16K 13/06 137/67 |
| 3,911,875 | A * | 10/1975 | Ysberg | F01L 3/18 123/41.34 |
| 4,090,524 | A | 5/1978 | Allread et al. | |
| 4,190,074 | A * | 2/1980 | Mailliet | C21B 7/005 137/315.16 |
| 5,095,937 | A * | 3/1992 | LeBlanc | B65D 90/26 137/312 |
| 5,392,810 | A * | 2/1995 | Cooper | F16K 15/038 137/512.1 |
| 5,711,343 | A * | 1/1998 | Beckett | F16K 15/038 137/512.1 |
| 8,714,190 | B2 * | 5/2014 | Shanker | F16K 15/038 137/512.1 |
| 10,072,776 | B2 * | 9/2018 | Kocourek | F16J 15/062 |
| 10,088,065 | B2 * | 10/2018 | Olejak | F16K 15/038 |
| 2007/0284119 | A1 | 12/2007 | Jackson et al. | |
| 2009/0259186 | A1 * | 10/2009 | Smith | A61B 17/3498 604/167.04 |
| 2011/0006240 | A1 | 1/2011 | Williams et al. | |
| 2020/0056516 | A1 * | 2/2020 | Mareau | F01L 3/16 |

OTHER PUBLICATIONS

Notice on the First Office Action and Search Report for Chinese Application No. 201780074468.7 dated May 13, 2020, 13 pages.

\* cited by examiner

LOW PARTICLE PROTECTED FLAPPER VALVE

BACKGROUND

Field

Embodiments of the present disclosure generally relate to a flapper valve and a processing chamber using the same.

Description of the Related Art

In the processing of semiconductor substrates, remote plasma sources (RPS) are used to provide ionized gas to processing chambers, for example, for cleaning or other processes. The RPS is typically connected to the processing chambers through conduits such as static feedthrough pipes. Conventional connections create a shared static volume between the RPS and the processing chamber. Due to the shared volume between the RPS and the processing chamber, particle contamination can occur on processed substrates due to particle sources from previous cleaning operations.

Attempts to mitigate particle contamination have included the use of isolation mechanisms. However, conventional isolation mechanisms often suffer from particle contamination issues due to mechanical actuation and sealing issues common to conventional isolation mechanisms. Additionally, conventional isolation mechanisms will not survive through-flow of radicalized gases due to the high thermal load imparted by recombination of the radicalized gases. The high thermal load results in early seal failure, imparting additional sources of particle contamination.

Therefore, there is a need for a new isolation mechanism.

SUMMARY

Embodiments of the present disclosure generally relate to a flapper valve.

In one embodiment, a flapper valve comprises a housing having a first opening at a first end thereof and a second opening at a second end thereof; a first flapper pivotably disposed in the housing; and a second flapper pivotably disposed in the housing, the first and second flappers movable to selectively open and close at least one of the first opening and the second opening, the first flapper and the second flapper overlapping in an open position.

In one embodiment, a flapper valve comprises a housing having a first opening at a first end thereof and a second opening at a second end thereof; a first flapper pivotably disposed in the housing, the first flapper having a seal coupled thereto, the seal contacting an interior surface of the housing and sealing the first opening when the first flapper is in a closed position; and a second flapper pivotably disposed in the housing, the second flapper positioned over the first flapper in an open position, and positioned over the second opening in the closed position.

In another embodiment, a method of opening a flapper valve comprises positioning a first flapper in an open position, the first flapper having a first seal thereon; positioning a second flapper in the open position, the first second flapper overlapping with the first flapper in the open position, wherein the second flapper includes a second seal which is positioned in contact with the first flapper in the open position and radially outward of the first seal of the first flapper; flowing an ionized or radicalized gas through the flapper valve while the first flapper and the second flapper are in the open position; closing the second flapper after flowing the ionized or radicalized gas through the flapper valve; and closing the first flapper after closing the second flapper.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of scope, as the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present disclosure generally relate to a flapper valve. The flapper valve may be used with processing chambers, such as semiconductor substrate processing chambers. However, other uses are also contemplated.

Figure 1:
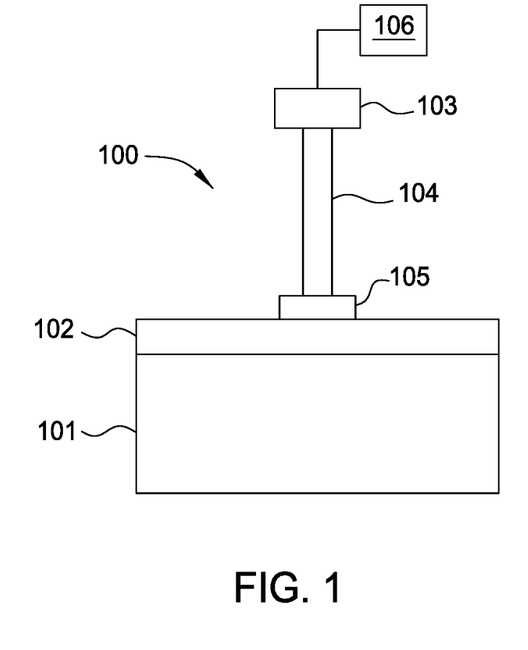
FIG. 1 is a schematic illustration of a processing chamber, according to one embodiment of the disclosure.

FIG. 1 is a schematic illustration of a processing chamber 100, according to one embodiment of the disclosure. The processing chamber 100 includes a chamber body 101 having a chamber lid 102 disposed thereon. An RPS 103 is coupled to an internal volume of the chamber body 101 via a conduit 104. An isolation mechanism, such as a flapper valve 105, isolates the internal volume of the chamber body 101 from the RPS 103. It is to be understood that the processing chamber 100 is illustrative of only one example of a processing chamber, and the use of other chambers is contemplated. Exemplary processing chambers 100 are available from Applied Materials, Inc., of Santa Clara, Calif.

The processing chamber 100 may be used to house substrates, such as semiconductor substrates, therein. The one or more substrates housed therein may be subjected to one or more processes such as etching, implanting, deposition, and the like. The RPS 103 may be used to facilitate processing of the substrates, or may be used to clean internal surfaces of the chamber body 101 and the chamber lid 102. A gas source 106 selectively introduces desired gases to the RPS 103 to generate radicals and/or ions of the introduced gas.

FIGS. 2A-2D are schematic illustrations of a flapper valve 205, according to embodiments of the disclosure. The flapper valve 205 may be used in place of the flapper valve 105 illustrated in FIG. 1. The flapper valve 205 is illustrated as coupled to a mounting bracket 298, which in turn is coupled to the chamber lid 102 (shown in FIG. 1). The bracket 298 facilitates removal of the flapper valve 205 from the chamber lid to facilitate cleaning, maintenance, and/or replacement, via fasteners 299. Alternatively, it is contemplated that the flapper valve 205 may be connected directly to a chamber lid 102. One or more seals 281 facilitate sealing between one or more of the flapper valve 205, the bracket 298, and/or the chamber lid 101.

Figure 2A:
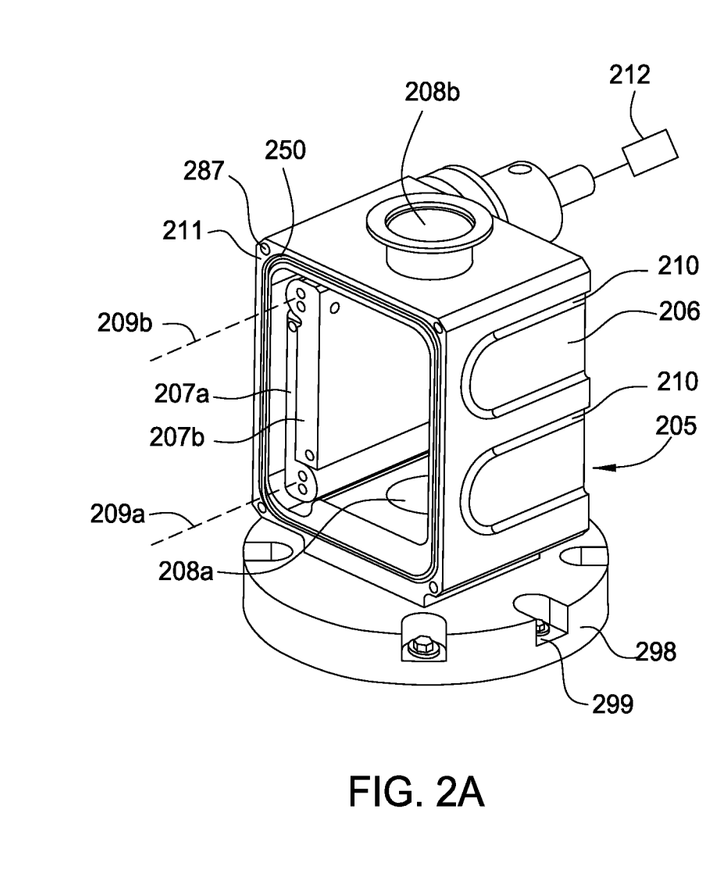
FIGS. 2A-2D are schematic illustrations of a flapper valve, according to embodiments of the disclosure.

FIG. 2A is a schematic sectional view of the flapper valve 205. The flapper valve 205 includes housing 206. The housing 206 is cubic and defines an enclosure housing one or more flappers (two are shown) 207a, 207b therein. The housing 206 includes a first opening 208a for receiving a radicalized and/or ionized process gas. A second opening 208b, positioned opposite the first opening 208a, facilitates egress of the radicalized and/or ionized process gas form the housing 206. In one example, the second opening 208b is positioned adjacent the mounting bracket 298, or a chamber lid 102. The openings 208a, 208b may be axially aligned relative to one another. The flappers 207a, 207b are pivotable about respective axis 209a, 209b via actuators 212 (one is shown) to allow the flow of the radicalized and/or ionized process gas through housing 206 of the flapper valve 205. The flapper 207a is pivotable from a location which obstructs or blocks flow of the radicalized or ionized gas through the opening 208a. Similarly, the flapper 207b is pivotable from a location which obstructs or blocks flow of the radicalized or ionized gas through the opening 208b.

The housing 206 includes one or more cooling channels 210 to optionally flow a cooling fluid therethrough. The cooling fluid facilities cooling of the flapper valve 205 during processing, thereby maintaining sealing integrity of the flapper valve 205 by mitigating seal degradation. Additionally, the housing 206 includes a removable door (shown removed) to facilitate maintenance of the flapper valve 205. The housing 206 includes a surface 211 having a groove 250 for receiving a seal (not shown), such as an O-ring. The removable door may be positioned in contact with the surface 211 and the seal to form an air-tight seal therewith, thus defining a volume of the housing 206. A plurality of openings 287 are formed in the surface 211 for receiving fasteners configured to couple the removable door to the housing 206.

Figure 2B:
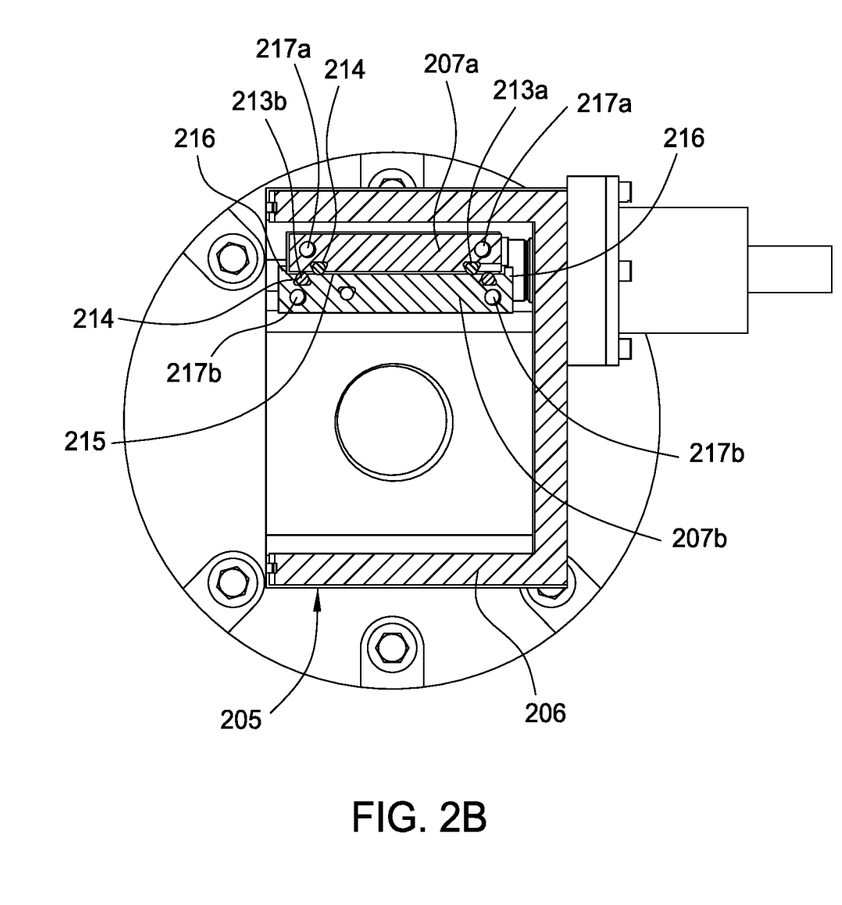

FIG. 2B illustrates a schematic top sectional view of the flapper valve 205. In FIG. 2B, the flapper valve 205 is illustrated in an open position which allows flow of gas therethrough. In the open position, the flappers 207a, 207b are pivoted to a position clear of the openings 208a, 208b. For example, the flappers 207a, 207b are positioned to a side of an internal volume of the housing 206. The flappers 207a, 207b are positioned in an overlapping orientation which minimizes the internal volume of the housing while also facilitating protection of sealing surfaces of the flappers 207a, 207b.

The flapper 207a includes a first sealing surface having one or more seals 213a coupled thereto. In one example, the one or more seals 213a are O-rings embedded in a seal groove 214. In the closed positioned, the one or more seals 213a encircle the opening 208a, preventing flow of radicalized/ionized gas therethrough. The reduced size of the opening 208a compared to the size of the seal 213a not only facilitates sealing, but also facilitates protection of the seal 213a by mitigating contact between the seal 213a and ionized/radicalized gases. Because the seal 213a has a larger diameter than the opening 208a, the seal 213a is spaced from the opening 208a, and thus, spaced from gases flowing therethrough.

The flapper 207b includes one or more seals 213b on a respective first sealing surface thereof. The one or more seals 213b may also be embedded in a corresponding seal groove 214. The seals 213b may be an O-ring or similar seal which circumscribes the one or more seals 213a in an open position of the flappers 207a, 207b. The larger radius or length/width of the seals 213b forms a protective seal around the one or more seals 213a when the flappers are in the open position, as shown. Thus, the one or more seals 213b prevent ionized or radicalized gases from degrading the one or more seals 213a as ionized or radicalized gases flow through the flapper valve 205. In such a setup, at least one seal, e.g., the seal 213a, remains functional despite ionized/radicalized gas flowing through the flapper valve 205 due to minimized contact with process gases, thereby maintaining isolation capabilities of the flapper valve 205.

To further facilitate protection of the one or more seals 213a, the flapper 207b includes a recessed surface 215 which accommodates or accepts the flapper 207a therein. The recessed surface is adjacent the flapper 207a in the open position. In one example, the recessed surface 215 has a length about equal to, or slightly larger than, the flapper 207a. For example, the recessed surfaced 215 may have a length of about 3 percent to about 15 percent greater than a length of the flapper 207a. In such an example, the length of the flapper 207b is greater than a length of the flapper 207a. The recessed surface includes extensions 216 adjacent thereto to form a labyrinth shape to reduce gas flow adjacent to the sealing surface of the flapper 207a.

Each flapper 207a, 207b includes respective cooling channels 217a, 217b formed therein. The cooling channels 217a, 217b permit the flow of a cooling fluid therethrough. Flow of the coolant through the flappers 207a, 207b may occur while ionized/radicalized gas is flowing through the flapper valve 205. The coolant maintains the temperatures of the flappers 207a, 207b within a range that preserves the integrity of the one or more seals 213a, 213b.

Figure 2C:
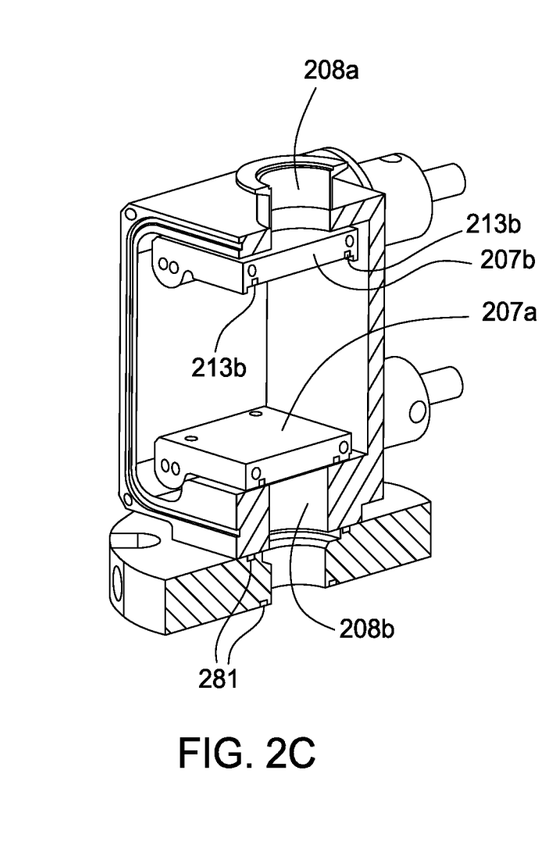

FIG. 2C illustrates the flapper valve 205 in a closed position. In the closed position, the flappers 207a, 207b prevent flow of radicalized/ionized gas from a RPS to a processing chamber. In the closed position, the flappers 207a, 207b are positioned adjacent respective openings 208a, 208b to prevent fluid flow through respective openings 208a, 208b. Because of the overlapping position of flappers 207a, 207b in the open position, the flappers 207a, 207b are actuated consecutively when moved into the closed position. For example, first the flapper 207b is moved into the closed position, which clears a travel path for flapper 207a to actuate into a closed positioned. With the flapper 207a in the closed position, the one or more seals 213a contact an interior surface of the housing 206 adjacent the opening 208a. The one or more seals 213a surround the opening 208a to prevent flow of gas therethrough. While the seals 213b do not contact an interior surface of the housing 206, as illustrated, it is contemplated that additional seals (not shown) may be positioned on the flapper 207b on a side opposite the seals 213b. The additional seals may form a seal around the opening 208b in the closed position, further improving the sealing ability of the flapper valve 205. However, it is contemplated that such additional seals may be exposed to ionized/radicalized gases, and therefore may benefit from frequent replacement to maintain sealing abilities.

Figure 2D:
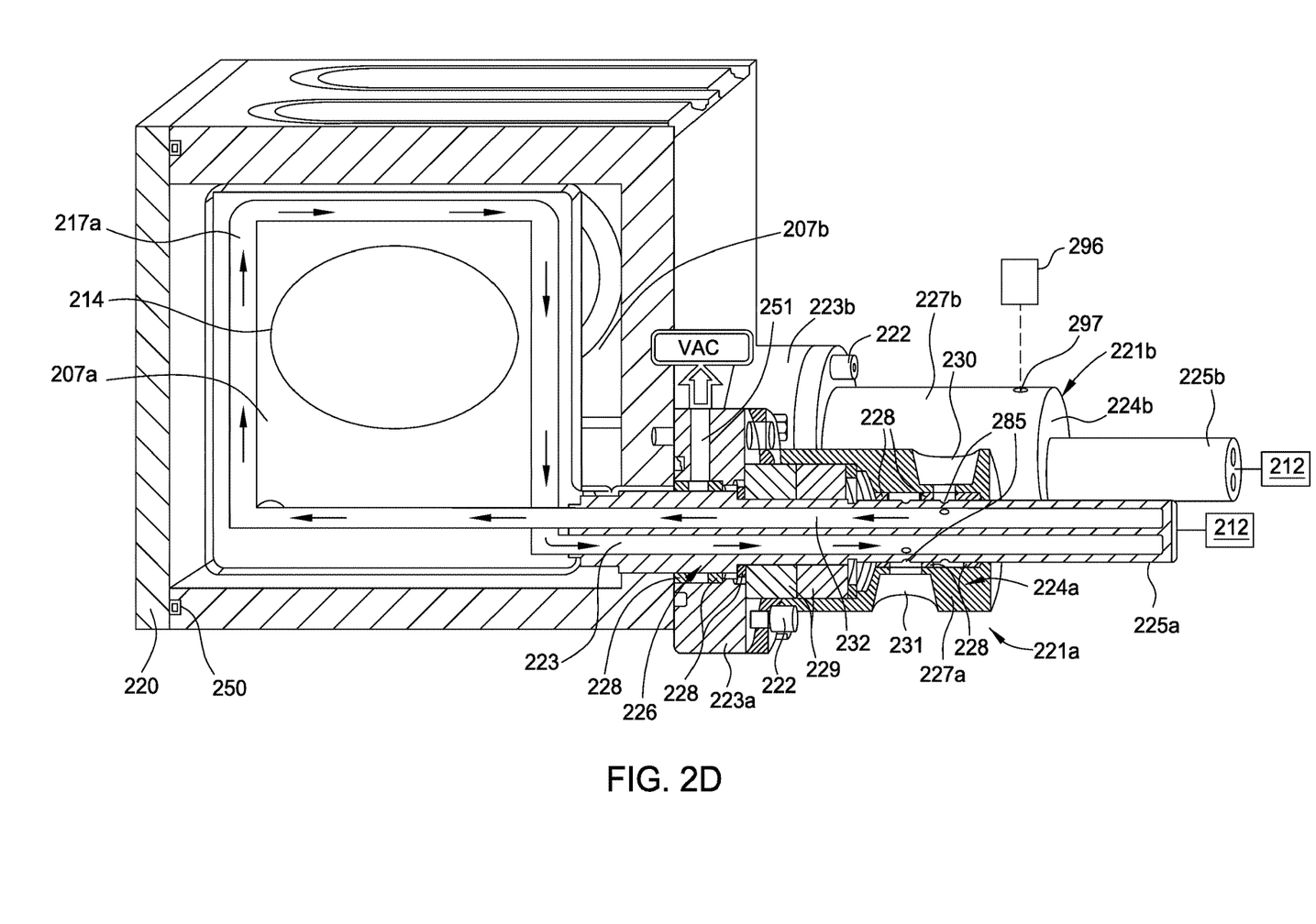

FIG. 2D illustrates a schematic sectional side view of the flapper valve 205. In FIG. 2D, the removable wall 220 is illustrated in contact with the housing 206 of the flapper valve 205. Opposite the removable wall 220, respective actuation assemblies 221a, 221b are coupled to an exterior surface of the housing 206 to facilitate actuation of the flappers 207a, 207b. Each actuation assembly 221a, 221b is secured to the housing by one or more fasteners 222, such as bolts. The fasteners 222 are disposed through respective bases 223a, 223b and water jackets 224a, 224b and secured to the housing 206. The base 223a is axially aligned with the water jacket 224a, while the base 223b is axially aligned with the water jacket 224b. A shaft 225a is disposed axially through the base 223a and water jacket 224a, while a second shaft 225b is disposed axially through the base 223b and water jacket 224b. Flappers 207a, 207b are coupled to first ends of respective shafts 225a, 225b, while a second end of the shafts 225a, 225b is coupled to one or more actuators 212 (two are shown) to facilitate rotational actuation of the shafts 225a, 225b and the flappers 207a, 207b coupled thereto. Each actuation assembly 221a, 221b may include a position sensor, for example integrated with a respective actuator 212, for determining a position of a respective flapper 207a, 207b, to mitigate interference therebetween and to facilitate determination of open/closed states of the flappers 207a, 207b. In an alternative example, an optical sensor may be utilized to determine positions of the shafts 225a, 225b, and thus flappers 207a, 207b, via identification of markings on the shafts 225a, 225b. In such an example, an optical sensor 296 may identify one or more markings 297 to facilitate rotational position of a shaft 225a or 225b.

Each base 223a, 223b includes a port 251 formed therein. Each port 251 extends radially from a central opening 226 to facilitate a vacuum connection thereto. Each base 223a, 223b includes one or more seals 228 formed on an interior surface of the central opening 226 for sealing about respective shafts 225a, 225b for directing fluid into from water inlet port 230 and to water outlet port 231. Respective water jackets 224a, 224b are coupled to each base 223a, 223b. Each water jacket 224a, 224b includes a housing 227a, 227b, through which the central opening 226 extends. One or more bearings 229 (two are shown in a stacked orientation) are positioned within each housing 227a, 227b adjacent the bases 223a, 223b. Shafts 225a, 225b are disposed axially through the bearings 229 to facilitate rotation of the shafts 225a, 225b. The bearings 229 facilitate alignment or adjustment of shaft position, and thus flapper position. Additionally, the bearings 229 are low friction bearings, and thus reduce rotational resistance of the shafts 225a, 225b.

Each housing 227a, 227b includes a water inlet port 230 and a water outlet port 231. The water inlet port 230 and the water outlet port 231 of each water jacket 224a, 224b are coupled to respective cooling channels 217a, 217b. The cooling channels 217a, 217b include an opening 285 adjacent the water inlet port 230 and the water outlet port 231 for receiving water therefrom or transferring water thereto. More than one opening 285, or an elongated opening 285, may be used to direct fluid into the cooling channels 217a, 217b at different rotational configurations of shafts 225a, 225b. Seals 228 positioned adjacent openings 225 direct water (or other cooling fluid) between the openings 285 and a respective water inlet port 230 or water outlet port 231.

During operation, a coolant such as water is provided to the water inlet port 230 and travels along a first fluid channel 232 extending axially along a respective shaft 225a, 225b. The first fluid channel 232 is fluidly coupled to or is an integral part of a respective cooling channel 217a, 217b. The cooling fluid travels through the cooling channels 217a, 217b and is transferred to the water outlet port 231 via a second cooling channel 233. The second cooling channel 233 is axially formed in a respective shaft 225a, 225b. The second cooling channel 233 is fluidly coupled to or integrally formed with a respective cooling channel 217a, 217b. The cooling fluid reduces the temperature of the flappers 207a, 207, thereby mitigating heat-induced damage to the seals 213a, 213b. It is to be noted that while the cooling channel 217a is illustrated as having a rectangular shape along the perimeter of the flapper 207a, other cooling channel configurations are contemplated for each of the cooling channels 217a, 217b.

FIGS. 2A-2D illustrate one embodiment of a flapper valve 205. However, other embodiments are also contemplated. For example, it is contemplated that one or both of flappers 207a, 207b may include a gas feedthrough for providing process or purge gases to the processing chamber 100. In such an example, the flappers 207a, 207b may be in a closed position, but allow gases fluidly coupled to the gas feedthrough to be introduced to the processing chamber 100. In addition, the flapper 207a may include one or more features to facilitate alignment between the flapper 207a and an interior surface of the housing 206, thereby minimizing abrasion and particle generation. For example, the flapper 207a may include one or more physical features such as guides, alignment marks, or the like to facilitate alignment.

Figure 3A:
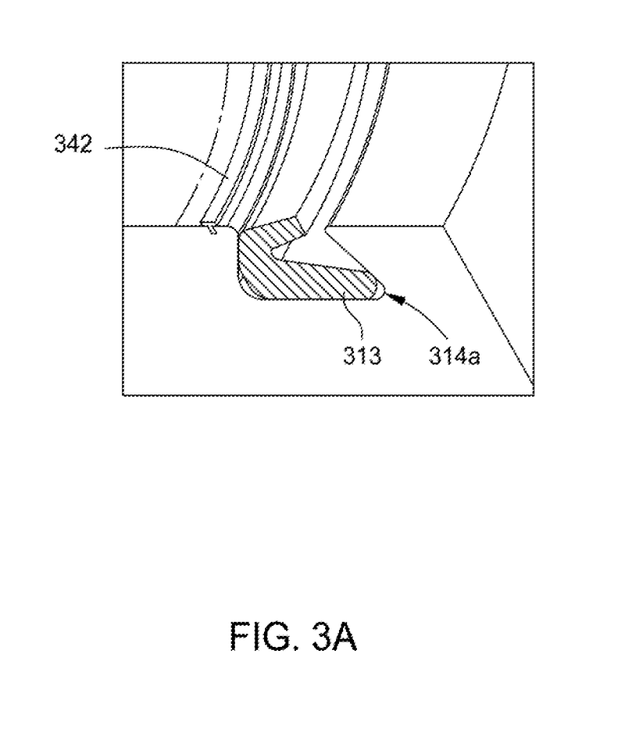
FIGS. 3A-3B are partial schematic sectional views of a seal, according to embodiments of the disclosure.
Figure 3B:
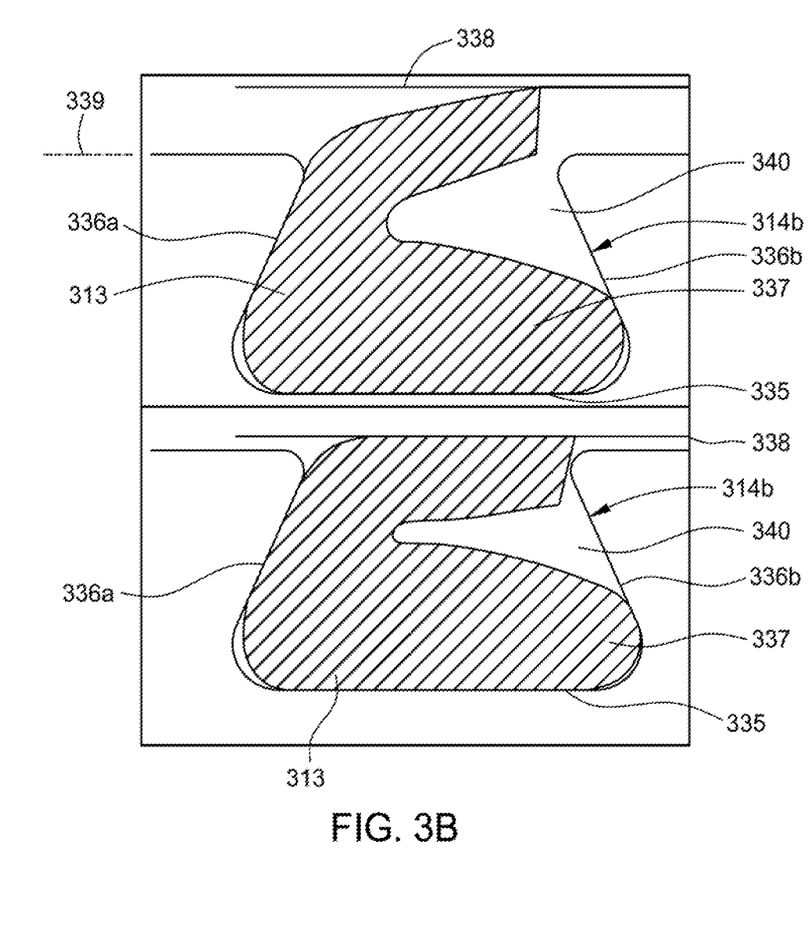

FIGS. 3A-3B are partial schematic sectional views of a seal 313, according to embodiments of the disclosure. While only seal 313 is illustrated, is to be understood that seal 213b may have a similar configuration. FIG. 3A illustrates the seal 313 positioned in a seal groove 314a. An optional back-up seal 342, such as a T-seal, may be positioned adjacent the seal 313. It is to be noted that the T-seal may be positioned on either side, or both sides, of the seal 313.

With respect to FIG. 3B, a groove 314a includes a bottom 335 and opposing sides 336a, 336b. Opposing sides 336a, 336b taper towards one another from the bottom 335. The inward taper of the opposing sides 336a, 336b facilitate retention of seal 313 in the groove 314b. The seal 313 includes a base 337 and a flag 338 extending therefrom. The base 337 is positioned in the groove 314b such that a lower surface of the base 337 is in contact with the bottom 335 of the groove 314b. The flag 338 is a cantilevered structure that extends from the base 337 opposite the bottom 335. Upon closure of a flapper 207a, 207b (shown in FIG. 2A) the flag 338 contacts the housing 206 (shown in FIG. 2A) to form a seal. Actuators 212 (shown in FIG. 2D) may be configured to apply a desired amount of contact force between the flag 338 and the housing 206. In an uncompressed state, the flag 338 extends beyond a plane 339 defining an upper boundary of the groove 314b. A space 340 is defined between an upper surface of the base 337 and a lower surface of the flag 338 to accommodate deflection of the flag under compression, as illustrated in FIG. 3B.

In operation, a vacuum may be applied to an interior of the flapper valve 205 to reduce the internal pressure thereof. The reduced pressure allows for a lower contact pressure to be used between the seal 213a and the housing 206 while still maintaining adequate sealing. The reduced contact pressure extends the useful life of the seal 213a, and additionally, also reduces unwanted particulate generation. The reduced particulate generation results in improved substrate processing, and increases the timespan between preventative maintenance sessions for the flapper valve 205. Additionally, it is contemplated that the seal 213a has a relatively low stiffness to further facilitate reduce particle generation as well as to compensate for seal misalignment.

In one example, vacuum is applied through the port 251. The vacuum applied through port 251 may be used to evacuate an internal volume of the housing 206 when the flapper valve 205 is closed. To facilitate evacuation, a port (not shown) formed in a respective shaft 225a, 225b may provide fluid communication between the port 251 and an internal volume of the housing 206 when the flappers 207a and/or 207b are in a closed position. Evacuating processes gases from the internal volume through the port 251 facilitates seal integrity by reducing contact between seals of the flapper valve 205 and processes gases which would otherwise be trapped therein in a closed state. Additionally or alternatively, one or more ports may be formed in the housing 206 for evacuation of gases from an internal volume thereof.

Figure 4:
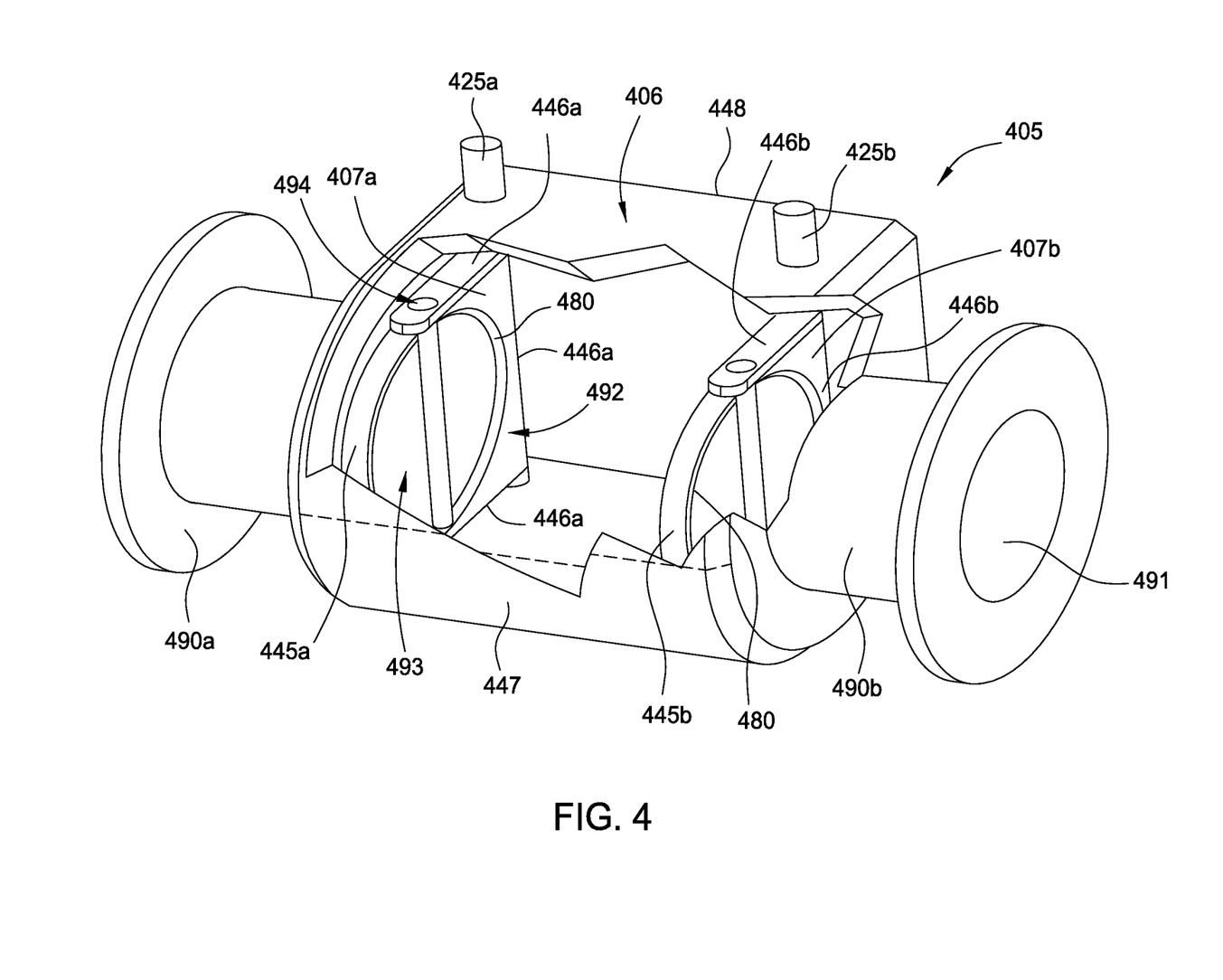
FIG. 4 is a schematic illustration of a flapper valve, according to another embodiment of the disclosure.

FIG. 4 is a schematic illustration of a flapper valve 405, according to another embodiment of the disclosure. The flapper valve 405 is similar to the flapper valve 205 illustrated above. However, the flapper valve 405 utilizes a different housing 406 and flappers 407a, 407b. As illustrated in FIG. 4, the flappers 407a, 407b each have a perimeter which includes respective rounded sections 445a, 445b, and three respective linear sections 446a, 446b. The housing 406 includes a corresponding shape, e.g., a first rounded section 447, and rectangular section 448. The corresponding structure between the housing 406 and the flappers 407a, 407b reduces the dead space of the flapper valve 405 in which material may be trapped, thereby reducing processing chamber contamination during processing. It is to be noted that other shapes and configurations are contemplated. In one example, each rounded section 445a, 445b and 447 extends about 180 degrees.

The flapper valve 405 also includes flanged couplings 490a, 490b adjacent respective flappers 407a, 407b to facilitate coupling to gas conduits, an RPS, a processing chamber, and the like. Each flanged coupling 490a, 490b includes an opening 491 formed therethrough for facilitating gas flow through the flapper valve 405. The openings 491 are positioned coaxially to facilitate gas conductance therethrough. Shafts 425a, 425b extend from the housing 406, similar to shafts 225a, 225b (shown in FIG. 2D) to facilitate actuation and cooling of the flappers 407a, 407b. Each shaft 425a, 425b may extend through an opposite side of the housing 406 to facilitate the inclusion of additional bearings, such as bearings 229 shown in FIG. 2D, for decreased rotational resistance of the flappers 407a, 407b.

Each flapper 407a, 407b includes a support portion 492 and a seal portion 493. The support portion 492 includes an arced surface having a matching contour to a section of the seal portion 493. The seal portion 493 is coupled to the support portion 492 via a coupling 494, such an extension of the seal portion 493 inserted into a recess or opening in the support portion 492. Other coupling mechanisms are also contemplated. In such an example, the seal portion 493 includes an engagement area 480 disposed around the perimeter of the seal portion 493. The engagement area 480 contacts an inner surface of the housing 406 to form a seal therewith. The engagement area 480 has a larger diameter than an opening over which the seal portion 493 seals.

The utilization of separate a separate support portion 492 and a seal portion 493 facilitates ease of replacement of the seal portion 493 during maintenance. A similarly described above with respect to flappers 207a, 207a, it is contemplated that one seal portion 493 may protect or otherwise restrict fluid contact with the other seal portion 493 when the flappers 407a, 407b are in the open position. Thus, longevity of seal integrity is promoted. Alternatively, the flappers 407a, 407b include seal arrangements as similarly described above with respect to flappers 207a, 207b. Additionally or alternatively, interior surfaces of the housing 406 and/or surfaces of the flappers 407a, 407b may be coated with a protective film, such as a ceramic, to facilitate protection of the flapper valve 405 from corrosive gases used during operation.

Benefits of the disclosure include improved isolation between an RPS and a processing chamber. Additionally, thermal loads on the flapper valves disclosed herein are reduced, thereby improving seal longevity and integrity.

While the foregoing is directed to embodiments of the present disclosure, other and further embodiments of the disclosure may be devised without departing from the basic scope thereof, and the scope thereof is determined by the claims that follow.

What is claimed is:

1. A flapper valve, comprising:
a housing having a first opening at a first end thereof and a second opening at a second end thereof;
a first flapper pivotably disposed in the housing; and
a second flapper pivotably disposed in the housing, the first flapper and the second flapper movable to selectively open and close at least one of the first opening and the second opening, the first flapper and the second flapper overlapping in an open position, the first flapper disposed on a first rotating shaft and the second flapper disposed on a second rotating shaft, the first rotating shaft and the second rotating shaft each having seals disposed therearound, the seals isolating an internal volume of the housing from an environment outside the housing.

2. The flapper valve of claim 1, further comprising a first seal on the first flapper and a second seal on the second flapper, wherein the first seal overlaps the second seal when the first flapper and the second flapper are in open positions.

3. The flapper valve of claim 1, wherein the first flapper and the second flapper are positioned face-to-face when in an open position.

4. The flapper valve of claim 1, wherein the first flapper and the second flapper are independently cooled by flowing fluid through respective cooling channels formed in the first flapper and the second flapper.

5. The flapper valve of claim 4, wherein the first flapper and the second flapper are cooled independently of the housing, the housing having one or more cooling channels formed therein.

6. The flapper valve of claim 1, further comprising one or more sensors for determining positions of the first and second rotating shafts.

7. The flapper valve of claim 6, wherein the sensors are optical sensors.

8. The flapper valve of claim 1, wherein axes of the first and second rotating shafts are adjustable via a low friction bearing.

9. The flapper valve of claim 1, wherein one or more surfaces of the first flapper or the second flapper have a coating thereon to reduce corrosion.

10. The flapper valve of claim 1, wherein the first opening of the housing and the second opening of the housing are positioned coaxially.

11. The flapper valve of claim 1, wherein the housing includes one or more gas purge ports to evacuate gases from the housing.

12. The flapper valve of claim 1, wherein the first flapper includes a gas feedthrough to supply process gas or purge gas to a process chamber.

13. A flapper valve, comprising:
a housing having a first opening at a first end thereof and a second opening at a second end thereof;

a first flapper pivotably disposed in the housing, the first flapper having a first seal coupled thereto, the first seal contacting an interior surface of the housing and sealing the first opening when the first flapper is in a closed position; and a second flapper pivotably disposed in the housing, the second flapper having a second seal coupled thereto, the second flapper positioned over the first flapper and the second seal surrounding the first seal in an open position, and the second flapper positioned over the second opening in the closed position.

14. The flapper valve of claim 13, wherein the first flapper and the second flapper are independently cooled by flowing fluid through respective cooling channels formed in the first flapper and the second flapper.

15. The flapper valve of claim 13, wherein the first flapper is disposed on a first rotating shaft and the second flapper is disposed on a second rotating shaft, the first rotating shaft and the second rotating shaft each having seals disposed therearound, the seals isolating an internal volume of the housing from an environment outside the housing.

16. The flapper valve of claim 15, wherein axes of the first and second rotating shafts are adjustable via a low friction bearing.

17. The flapper valve of claim 15, further comprising one or more sensors for determining a position of the first and second rotating shafts.

18. The flapper valve of claim 13, wherein the first opening at the first end of the housing and the second opening of the second end of the housing are positioned coaxially.

19. A method of opening a flapper valve, comprising:
positioning a first flapper in an open position, the first flapper having a first seal thereon;
positioning a second flapper in the open position, the first second flapper overlapping with the first flapper in the open position, wherein the second flapper includes a second seal which is positioned in contact with the first flapper and surrounding the first seal in the open position;
flowing an ionized or radicalized gas through the flapper valve while the first flapper and the second flapper are in the open position;
closing the second flapper after flowing the ionized or radicalized gas through the flapper valve; and
closing the first flapper after closing the second flapper.

20. The method of claim 19, wherein the first flapper is disposed on a first rotating shaft and the second flapper is disposed on a second rotating shaft, the first rotating shaft and the second rotating shaft each having seals disposed therearound, the seals isolating an internal volume of a housing from an environment outside the housing.

* * * * *